United States Patent

Jordan

[11] Patent Number: 5,975,315
[45] Date of Patent: Nov. 2, 1999

[54] EQUIPMENT RACK

[75] Inventor: Alan Jordan, Ballyclare, United Kingdom

[73] Assignee: Northern Telecom Limited, Montreal, Canada

[21] Appl. No.: 09/142,667
[22] PCT Filed: Jul. 12, 1996
[86] PCT No.: PCT/GB96/01662
§ 371 Date: Dec. 4, 1998
§ 102(e) Date: Dec. 4, 1998
[87] PCT Pub. No.: WO98/03048
PCT Pub. Date: Jan. 22, 1998
[51] Int. Cl.$^6$ .................................................. A47F 5/00
[52] U.S. Cl. ......................... 211/26; 211/189; 361/829; 312/265.4
[58] Field of Search ........................... 211/26, 189, 182; 361/829; 312/265.4

[56] References Cited

U.S. PATENT DOCUMENTS

| | | |
|---|---|---|
| 4,715,502 | 12/1987 | Salmon . |
| 5,004,107 | 4/1991 | Sevier et al. . |
| 5,566,836 | 10/1996 | Lerman ................................... 211/26 |
| 5,683,001 | 11/1997 | Masuda et al. ......................... 211/26 |
| 5,769,519 | 6/1998 | Nicolai ................................. 211/26 X |
| 5,788,087 | 8/1998 | Orlando ................................. 211/26 |
| 5,819,956 | 10/1998 | Rinderer ................................ 211/26 |
| 5,867,372 | 2/1999 | Shie .................................. 361/829 X |

*Primary Examiner*—Robert W. Gibson, Jr.
*Attorney, Agent, or Firm*—Lee, Mann, Smith, McWilliams, Sweeney & Ohlson

[57] ABSTRACT

An equipment rack has a strengthened base and folded side members to provide Zone 4 earthquake protection. When the rack is mounted on a support surface, the mounting bolts securing the rack are overtightened so as to distort the base member and thus prestress the structure. This improves rigidity when the rack is subjected to earthquake vibration.

11 Claims, 5 Drawing Sheets

Fig. 1a.
Fig. 1b.
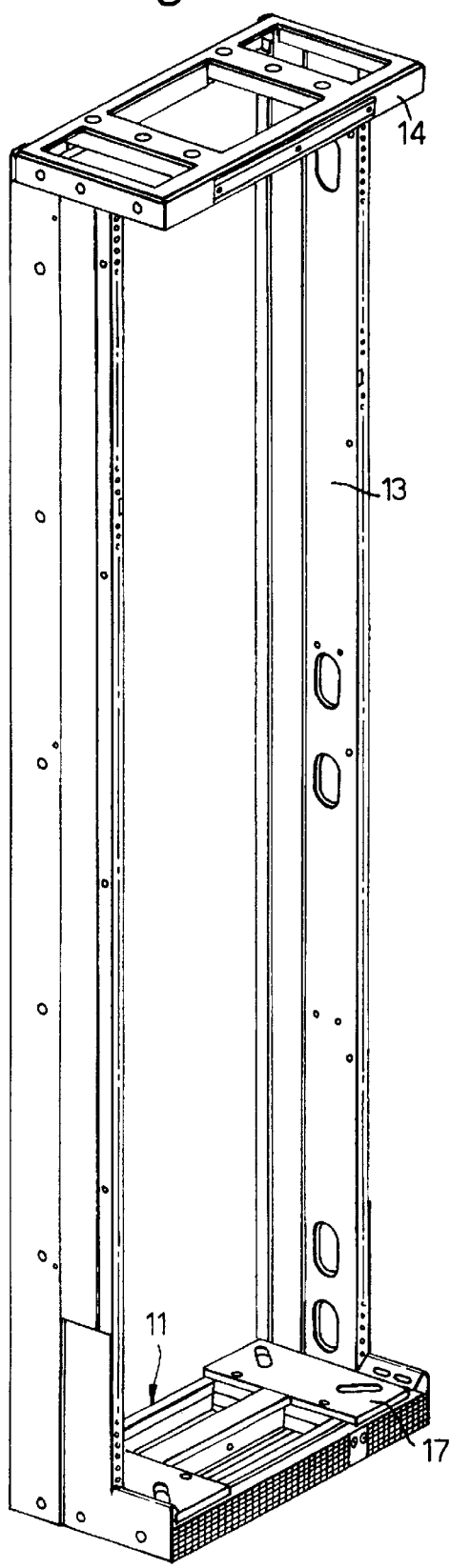
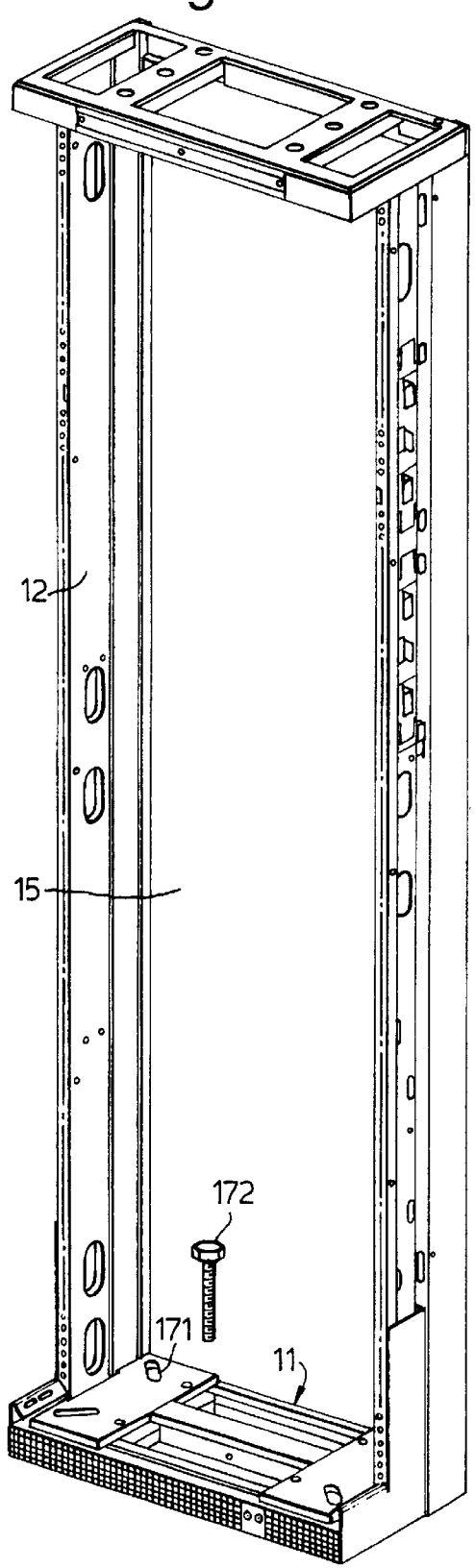

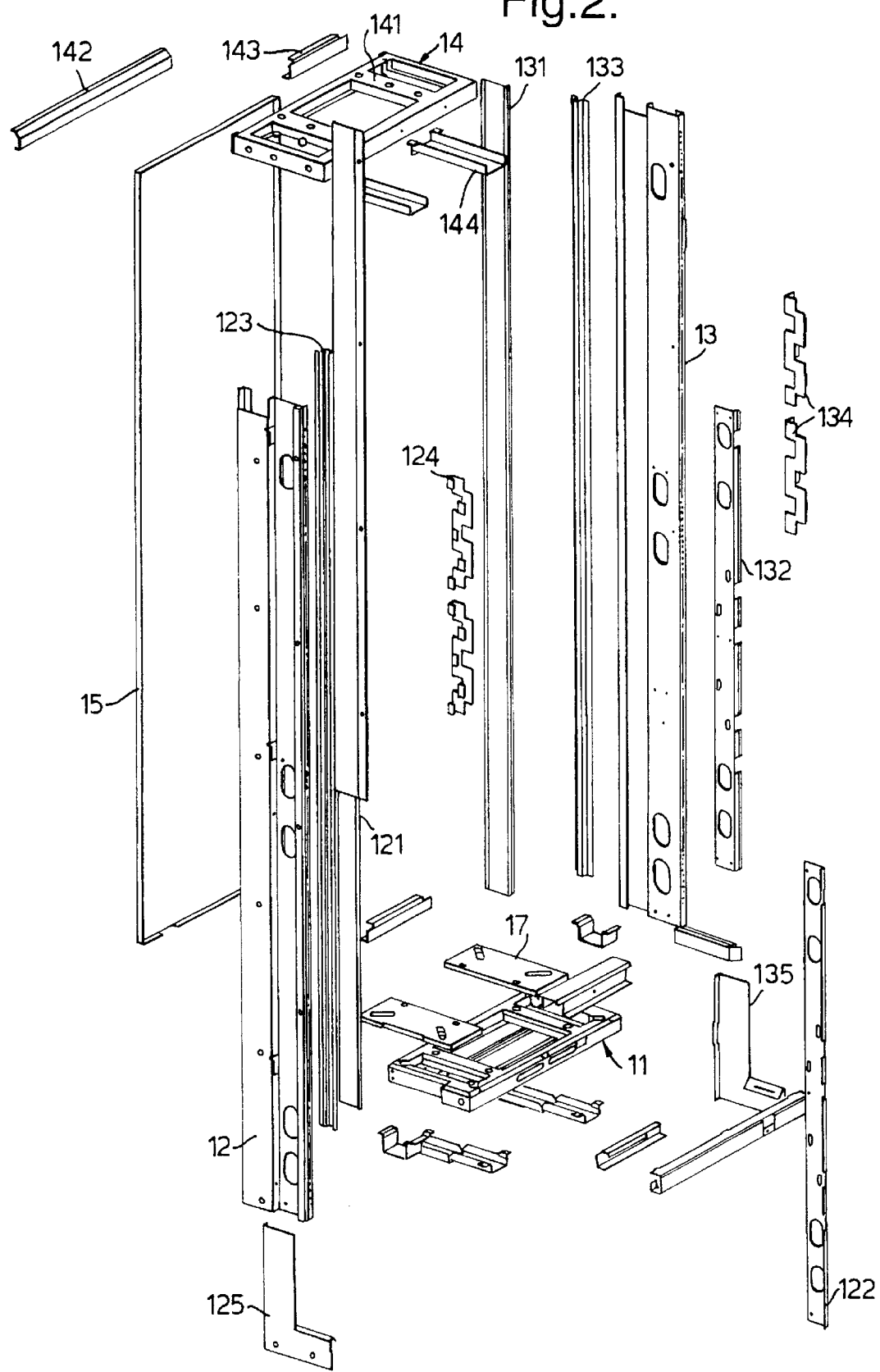

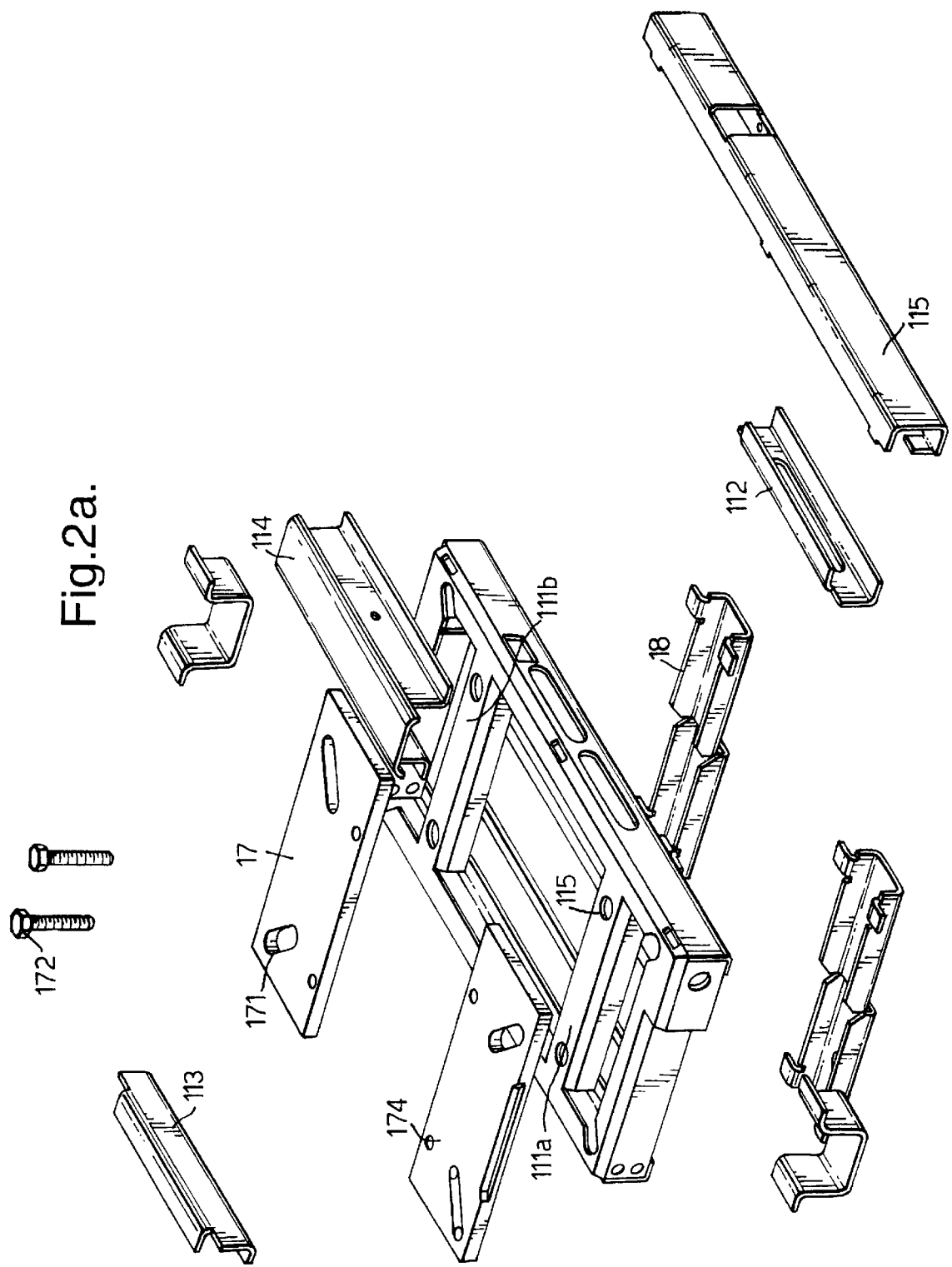

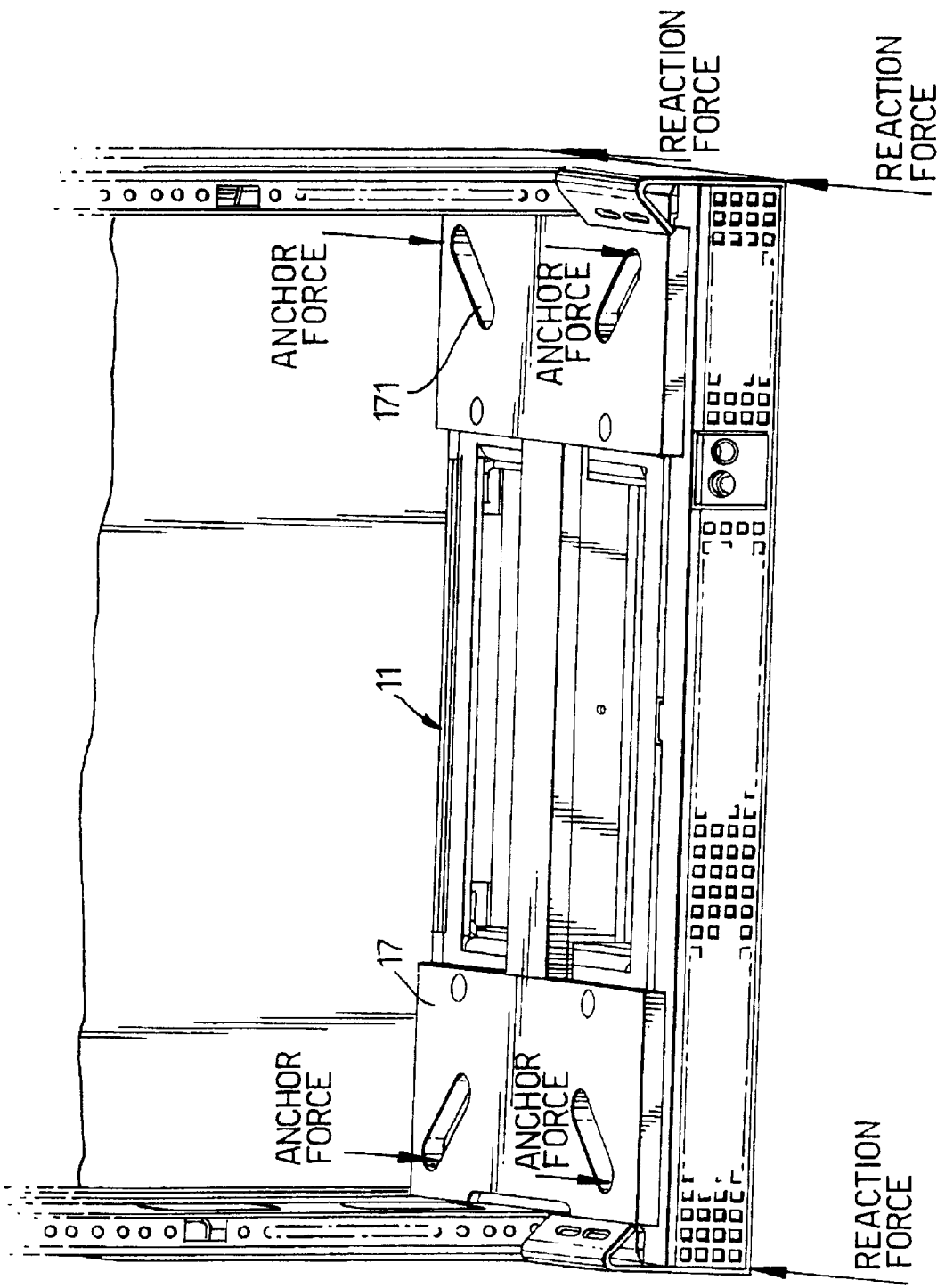

ID RACK

This invention relates to rack structures, e.g. for containing telecommunications equipment, and in particular to equipment racks provided with resistance to earthquake induced forces.

BACKGROUND OF THE INVENTION

There is an increasing need for ruggedised racking for the installation of telecommunication equipment, e.g. switching equipment, in zones that are potentially subject to earthquake damage. These earthquake zones are classified according to the potential risk and the magnitude of earthquake damage, the most severe damage being expected in zone 4. There is a requirement that, in the event of an earthquake, the equipment supported in the rack will be protected from damage so that a communication service can be maintained without interruption. To meet this objective, an equipment rack must provide effective damping of the earthquake induced vibrations so as to minimise the forces that are transferred to the equipment mounted in the rack. The requirements for earthquake resistance are described in a test procedure detailed in the Bellcore NEBS standard entitled GR-63-CORE, Network Equipment Building System (NEBS) which recommends applied forces and wave forms which the rack should be able to resist.

One approach to this problem is described in specification number U.S. Pat. No. 5,004,107 which describes a rack in which the base portion is reinforced with metal gussets to provide a strong box-like structure which braces the rack against applied forces. While this provides an effective rugged structure which is resistant to applied forces resulting from an earthquake, the box-like base section occupies a significant proportion of the rack volume and limits the quantity of equipment that can be supported on the rack. Thus a larger number of racks are required to house a given volume of equipment than would be the case with conventional racking systems. This can limit the use of such a rack in confined situations where space is at a premium.

The object of the invention is to minimise or to overcome this disadvantage.

It is a further object of the invention to provide an improved earthquake resistant rack construction.

SUMMARY OF THE INVENTION

According to one aspect of the invention there is provided an equipment rack for supporting communications equipment, including a generally rectangular base member, first and second side members extending from opposite sides of the base member in a direction perpendicular to the plane of the base member, a top member coupling the free ends of the side members, and means for securing the base member to a support surface, wherein the securing means is adapted to prestress the base member so as to transfer force from the base member to the side members whereby to raise the vibrational response of the rack to a value at which earthquake induced vibration of the rack is inhibited.

According to another aspect of the invention there is provided an earthquake resistant structure including a generally rectangular base frame member, first and second elongate side members extending from opposite sides of the base member in a direction perpendicular to the plane of the base member, a generally rectangular top member coupling the free ends of the side members, and means for securing the base member to a support surface, wherein the securing means is adapted to prestress and distort the base member so as to transfer force from the base member to the side members whereby to raise the vibrational response of the structure to a value at which earthquake induced vibration of the structure is inhibited.

According to a further aspect of the invention there is provided a method of mounting an equipment rack for supporting communications equipment on a support surface, the rack including a generally rectangular base member, first and second side members extending from opposite sides of the base member in a direction perpendicular to the plane of the base member, a top member coupling the free ends of the side members, and means for securing the base member to the support surface, wherein the method includes prestressing the base member via the securing means so as to transfer force from the base member to the side members whereby to raise the vibrational response of the rack to a value at which earthquake induced vibration of the rack is inhibited.

We have found that by prestressing the rack structure when the rack is mounted on a support surface, the natural frequency response of the rack is increased above a value, typically 6 Hz, beyond which the risk of damage to the mounted equipment in response to earthquake vibration is substantially reduced.

Typically the securing means comprises a number of mounting bolts which are over-tightened or over-torqued so as to distort the base and to generate the required level of prestressing of the structure. The torque required to effect the required degree of prestressing may be determined from simulation vibrational measurements on a sample rack, and this setting can then applied to all installed racks of that design.

The rack may contain e.g.. optical transmission equipment which is used to carry voice and data in bulk between remote points such as telephone exchanges or other telecommunications entities that require reliable high bit rate data connectivity.

BRIEF DESCRIPTION OF THE DRAWINGS

Embodiments of the invention will now be described with reference to the accompanying drawings in which:

FIGS. 1a and 1b are respective left hand and right hand general views of the earthquake resistant equipment rack;

FIG. 2 is an exploded view of the rack of FIGS. 1a and 1b showing the construction thereof;

FIG. 2a is an enlarged view of the base frame assembly of the rack structure of FIGS. 1a, 1b and 2;

FIG. 3 is a more detailed view of the base structure of the rack of FIGS. 1a, 1b, and 2 and illustrates the forces generated when the rack is mounted on a support surface.

DESCRIPTION OF PREFERRED EMBODIMENT

Figure 4B:
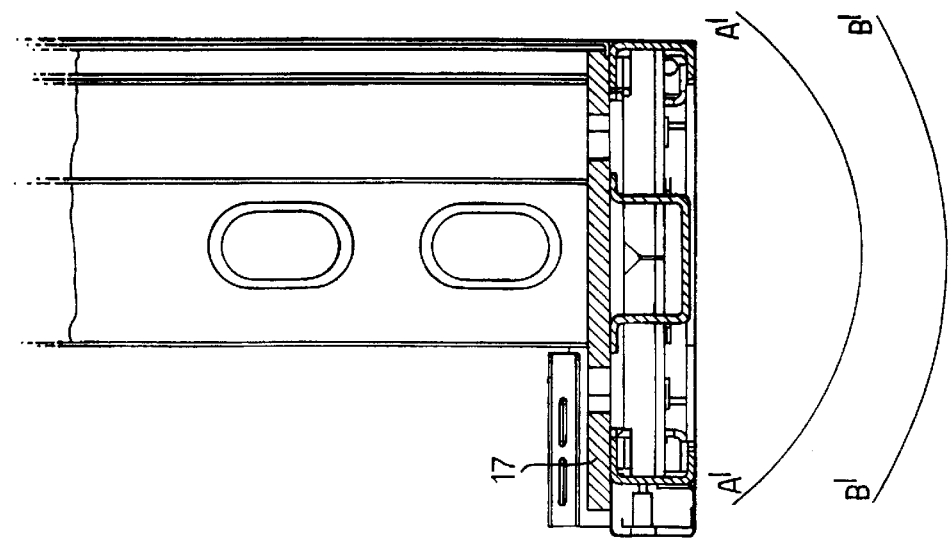
FIGS. 4a and 4b are longitudinal and transverse sectional views respectively of the base frame of the rack of FIGS. 1 to 3 and illustrate the effects of prestressing and distortion of the base frame introduced by mounting the rack on a support surface.

Referring first to FIGS. 1a, 1b, 2 and 2a, the rack which is constructed from steel sheet or plate comprises a generally rectangular base frame structure generally depicted as 11 to which side members 12 and 13 are secured e.g. by welding. The free ends of the side members 12 and 13 are coupled by a top frame 14 to form an elongate box-like frame structure. A rear cover plate 15 is secured to the side members. The side members 12 and 13 are folded to provide additional stiffness and to provide longitudinal cabling channels. Further stiffening of the assembly is provided by side stiffener members 121, 131 and 122,132, and by rear stiffener members 123, 133. Cabling brackets 124, 134 may be mounted on the respective side stiffener members 121,131 to retain cables (not shown) disposed in the cabling channels provided in the side members 12 and 13. The cabling channels in the side members may closed by side covers 136 (FIG. 1a). In the view of FIG. 1b the right hand side cover has been removed to expose the cable channel. The joints between the side members 12, 13 and the base assembly may be covered by respective L-shaped cover plates 125, 135.

The base frame (FIG. 2a) is constructed as a welded structure from sheet steel which has been folded to provide a generally rectangular cross sectioned tube and is braced by first and second transverse members 111a, 111b, and by a cross member 16 disposed between the transverse members. Further bracing or stiffening of the base frame is provided by base stiffener members 112, 113 attached to the front and rear respectively of the base frame and a longitudinal member 114 disposed between the transverse members. A kick plate 115 may also be attached to the front surface of the base frame. First and second anchor plates 17 formed from steel plate are disposed on the base frame whereby the rack may be secured to a support surface. The anchor plates are provided each with slotted openings 171 for receiving bolts 172 for engaging corresponding threaded mounts (not shown) provided in the support surface. Foot bracket members 18 provide a mounting for the base frame structure 11 on the support surface. Further openings 174 are provided in each anchor plate 17 in register with corresponding openings 115 in the respective transverse member 111a, 111b, for receiving screw threaded adjustment feet (not shown) which may be used for mounting the rack on an uneven surface. In some applications the anchor plates may be replaced by bar members which perform an equivalent function.

The rack top frame 14 (FIG. 2) is of similar construction to that of the base frame and comprises a generally rectangular structure which is braced by transverse members 141 and by front and rear stiffeners 142 and 143 respectively. In an optional arrangement, first and second bracket members 144 secured to the top frame may be used to secure the top of the rack to an overhead support (not shown).

For clarity, no electronic equipment is shown mounted in the rack, but it will be clear that the rack can support telecommunications equipment disposed on circuit boards or cards which can be secured to the rack in the normal manner. This equipment may form part of a conventional wired or optical communications system, or it may form part of a mobile or a fixed access cellular communications system.

Figure 4A:
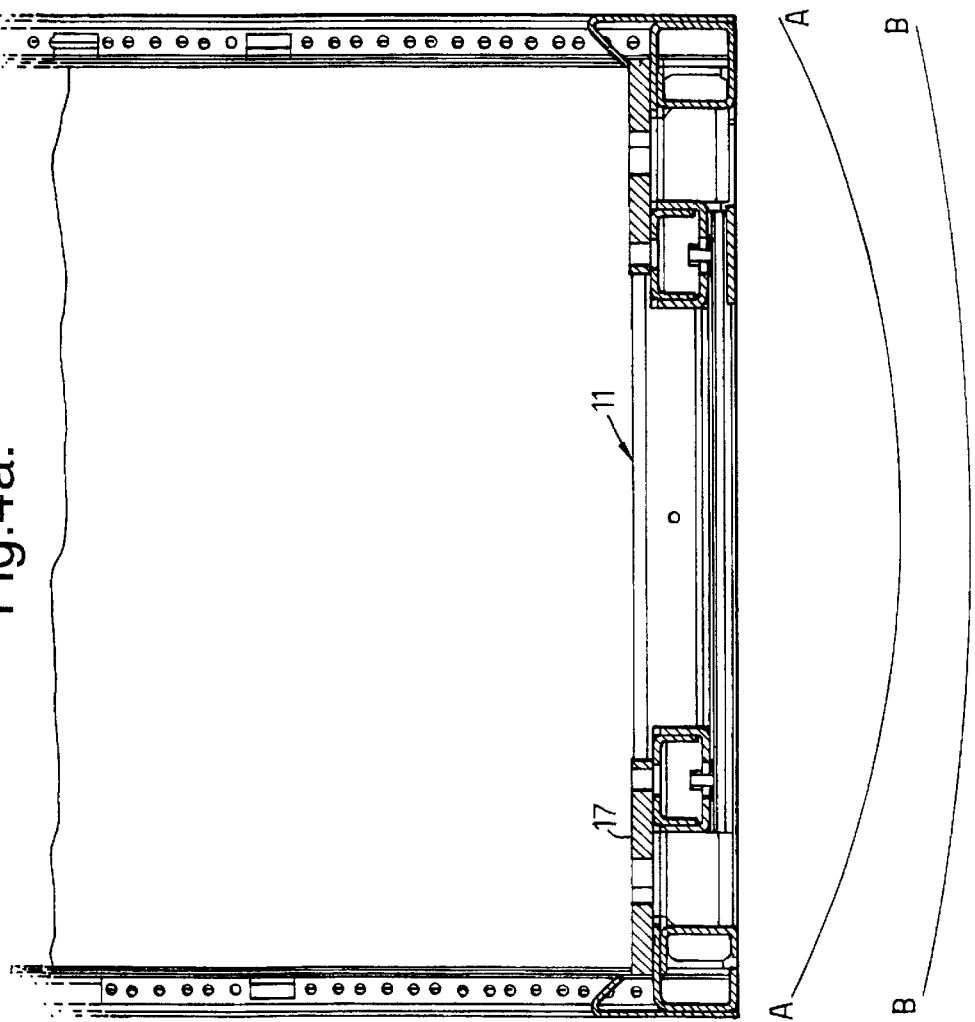

The rack assembly is in use secured to a substantially horizontal mounting surface via anchor bolts 172 which are located in the slotted openings 171 in the anchor plates 17 these openings being disposed inboard of the base frame periphery. As discussed above, the bolts engage corresponding threaded mounts (not shown) provided at appropriate positions in the mounting surface, the slotted openings providing a degree of leeway or tolerance in the positioning of the threaded mounts. The anchor bolts 172 are fully tightened to secure the base frame structure 11 in abutment with the mounting surface and are then further tightened so as to prestress the base frame by providing a slight distortion thereof. As shown in FIG. 3, this provides a downward force against the base structure and a corresponding reaction force on the base structure from the support surface. The effect of further tightening of the anchor bolts is illustrated in FIGS. 4a and 4b which show respectively longitudinal and transverse cross-sections of the base of the rack. As the anchor bolts 172 are further tightened, the anchor plates 17 are strained and the inner portions of the base frame structure are compressed relative to the outer portions so that the upper surface of the base frame structure assumes a dished or concave configuration. The magnitude of the distortion is small and is within the elastic limit of the base material and of the anchor plates. Typically this distortion is less than 1 mm. For explanatory purposes the distortion has been shown exaggerated in FIGS. 4a and 4b. The distortion of the base resulting from the over tightening of the anchor bolts is illustrated schematically by the curves A—A and A'–A' in FIGS. 4a and 4b respectively. When the rack is subjected to a seismic shock resulting from an earthquake, the forces imparted to the base structure via the support surface cause the base structure to distort between its normal dished concave configuration and a concave configuration of smaller radius of curvature, i.e. a more dished configuration, so as to absorb some of the received vibrational energy. This distortion is illustrated schematically by the curves B—B and B'–B' in FIGS. 4a and 4b respectively.

This prestressing and consequent slight distortion of the base structure transfers part of the prestressing force to the side members of the rack so as to introduce a slight bending of the side members, i.e. so as to cause a slight inward bowing of the side members. We have found that this introduction of strain into the side members improves the resistance of the rack to low frequency vibrations resulting from a seismic shock. These vibrations have a broad frequency spectrum, but it is generally accepted that it is the low frequency vibrations that cause maximum damage. The accepted industry standard described in the Bellcore NEBS documentation requires that, to provide adequate resistance to Zone 4 earthquake conditions, the rack should not respond to frequencies below 6 Hz. This document also specifies suitable wave forms for application to the structure on test. A sample of the rack to be tested is mounted on a horizontal platform which is subjected to vibrations of various frequencies and the response of the rack to those applied vibrations is determined. For the purposes of the test, the upper portion of the rack is loaded with a mass of 100 pounds to represent the maximum quantity of equipment which the rack will hold when in service. This test is detailed in the Bellcore NEBS document referred to above. We have found that by providing an appropriate degree of prestress of the base structure, the minimum frequency to which the rack responds can be raised to at least 6 Hz and typically to about 9 Hz, i.e. well above the frequencies at which significant damage can occur.

The precise degree of over tightening of the anchor bolts to distort the anchor bars and base frame to provide the desired prestressing will depend on the base construction and the total area or footprint of the base member and can be determined by experiment by tightening the anchor bolts to various torque settings and subjecting the rack to the Bellcore earthquake simulation test. In this way an optimum torque setting can be determined for a particular rack construction, and this torque setting is then applied to all similar racks when these are installed. For example, for an equipment rack having a standard ETSI footprint of 600× 300 mm and a height of 2200 mm, we have found that tightening the anchor bolts to a torque of 50 to 70 pound foot (74 to 133 newton meters) provides the rack with effective zone 4 earthquake resistance as determined by the above described Bellcore test procedure.

It will be understood that the foregoing description of a preferred embodiment of an earthquake resistant rack is given by way of example only and that those skilled in the art will be aware of modifications which do not depart from the spirit and scope of the invention.

I claim:

1. An equipment rack for supporting communications equipment, including a generally rectangular base member, first and second elongate side members extending from opposite sides of the base member in a direction perpendicular to the plane of the base member, a top member coupling the free ends of the side members, and means for securing the base member to a support surface, wherein the securing means is adapted to distort and prestress the base member so as to transfer force from the base member to the side members whereby to raise the vibrational response of the rack to a value at which earthquake induced vibration of the rack is inhibited.

2. An equipment rack as claimed in claim 1, wherein said prestressing of the base member applies a compressive force to an inner region of the base member so as to compress that inner region relative the outer region of the base member.

3. An equipment rack as claimed in claim 2, wherein said base member comprises a generally rectangular frame structure having an outer periphery surrounding a rectangular opening.

4. An equipment rack as claimed in claim 3, wherein said base member incorporates transverse brace members disposed between opposite sides of the frame periphery across said opening.

5. An equipment rack as claimed in claim 1, wherein said first and second side members are folded in a longitudinal direction so as to define respective cable channels thereonlong.

6. An equipment rack as claimed in claim 5, wherein said side members are provided with stiffener members.

7. An equipment rack as claimed in claim 6, wherein cable retaining means are provided in said channels.

8. An equipment rack as claimed in claim 3, wherein said securing means comprises first and second anchor bars or plates disposed transverse to the base member and having openings inboard of the periphery of the base member for receiving respective bolts engaging corresponding threaded mounts in the mounting surface, said prestressing of the base being achieved by applying a torque to the bolts sufficient to urge the base member against the mounting surface and to distort and prestress the base member.

9. An earthquake resistant structure including a generally rectangular base frame member, first and second elongate side members extending from opposite sides of the base member in a direction perpendicular to the plane of the base member, a generally rectangular top member coupling the free ends of the side members, and means for securing the base member to a support surface, wherein the securing means is adapted to prestress and distort the base member so as to transfer force from the base member to the side members whereby to raise the vibrational response of the structure to a value at which earthquake induced vibration of the structure is inhibited.

10. A method of mounting an equipment rack for supporting communications equipment on a support surface, the rack including a generally rectangular base member, first and second side members extending from opposite sides of the base member in a direction perpendicular to the plane of the base member, a top member coupling the free ends of the side members, and means for securing the base member to the support surface, wherein the method includes prestressing the base member via the securing means so as to transfer force from the base member to the side members whereby to raise the vibrational response of the rack to a value at which earthquake induced vibration of the rack is inhibited.

11. A method as claimed in claim 10, wherein said securing means comprise a plurality of bolts engaging corresponding threaded mounts in the support surface, and wherein said method includes applying a torque to said bolts sufficient to distort and prestress the base member.

* * * * *